(12) United States Patent
Then et al.

(10) Patent No.: US 11,658,217 B2
(45) Date of Patent: May 23, 2023

(54) TRANSISTORS WITH ION- OR FIXED CHARGE-BASED FIELD PLATE STRUCTURES

(71) Applicant: Intel Corporation, Santa Clara, CA (US)

(72) Inventors: Han Wui Then, Portland, OR (US); Marko Radosavljevic, Portland, OR (US); Glenn A. Glass, Portland, OR (US); Sansaptak Dasgupta, Hillsboro, OR (US); Nidhi Nidhi, Hillsboro, OR (US); Paul B. Fischer, Portland, OR (US); Rahul Ramaswamy, Portland, OR (US); Walid M. Hafez, Portland, OR (US); Johann Christian Rode, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 798 days.

(21) Appl. No.: 16/242,670

(22) Filed: Jan. 8, 2019

(65) Prior Publication Data

US 2020/0219986 A1 Jul. 9, 2020

(51) Int. Cl.
*H01L 29/00* (2006.01)
*H01L 29/40* (2006.01)
(Continued)

(52) U.S. Cl.
CPC .......... *H01L 29/405* (2013.01); *H01L 21/265* (2013.01); *H01L 29/205* (2013.01);
(Continued)

(58) Field of Classification Search
CPC ... H01L 29/402; H01L 29/404; H01L 29/405; H01L 29/7786
See application file for complete search history.

(56) References Cited

U.S. PATENT DOCUMENTS

| | | | |
|---|---|---|---|
| 2002/0145172 A1* | 10/2002 | Fujishima | H01L 29/404 257/E29.268 |
| 2013/0256686 A1* | 10/2013 | Kanamura | H01L 29/207 438/478 |
| 2016/0322969 A1* | 11/2016 | Padmanabhan | H01L 29/742 |

OTHER PUBLICATIONS

Xiong, Jiayun, et al., "Novel high voltage RESURF AlGaN/GaN HEMT with charged buffer layer," Science China Information Sciences, Apr. 2016, vol. 59 042410:1-042410:10; doi: 10.1007/s11432-015-5454-z, 10 pages.

* cited by examiner

*Primary Examiner* — Reema Patel
(74) *Attorney, Agent, or Firm* — Akona IP

(57) ABSTRACT

Disclosed herein are IC structures, packages, and devices assemblies that use ions or fixed charge to create field plate structures which are embedded in a dielectric material between gate and drain electrodes of a transistor. Ion- or fixed charge-based field plate structures may provide viable approaches to changing the distribution of electric field at a transistor drain to increase the breakdown voltage of a transistor without incurring the large parasitic capacitances associated with the use of metal field plates. In one aspect, an IC structure includes a transistor, a dielectric material between gate and drain electrodes of the transistor, and an ion- or fixed charge-based region within the dielectric material, between the gate and the drain electrodes. Such an ion- or fixed charge-based region realizes an ion- or fixed charge-based field plate structure. Optionally, the IC structure may include multiple ion- or fixed charge-based field plate structures.

25 Claims, 9 Drawing Sheets

(51) Int. Cl.
*H01L 21/265* (2006.01)
*H01L 29/778* (2006.01)
*H01L 29/205* (2006.01)
(52) U.S. Cl.
CPC .......... *H01L 29/404* (2013.01); *H01L 29/408* (2013.01); *H01L 29/7786* (2013.01)

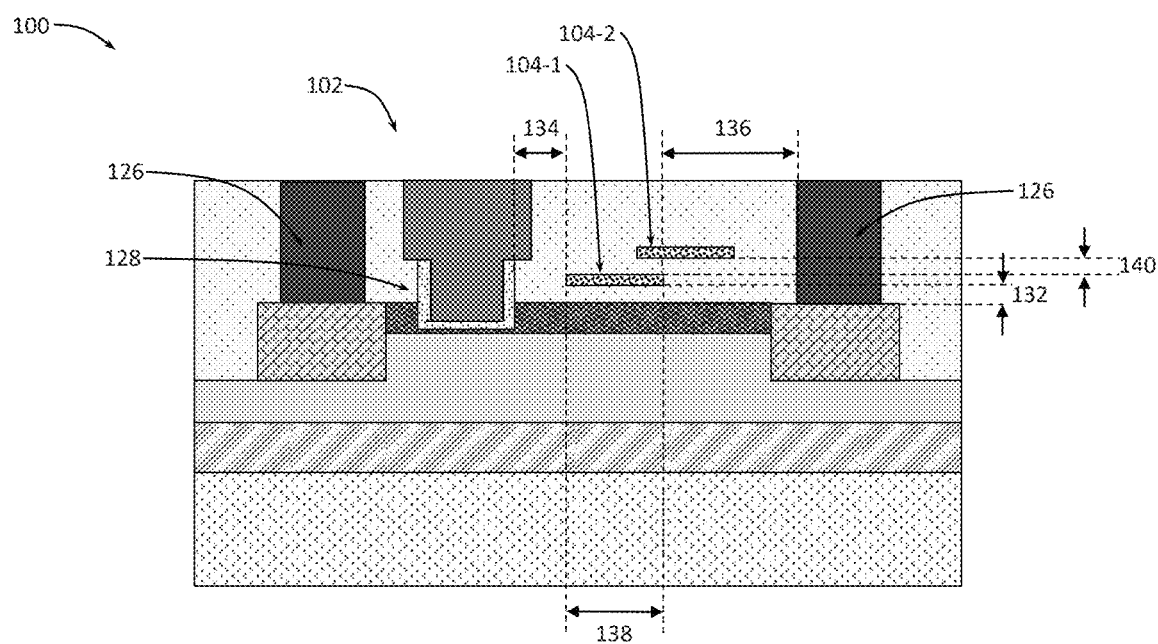
FIG. 2
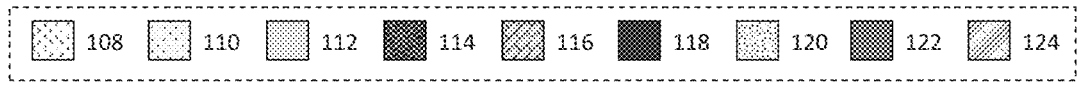

402
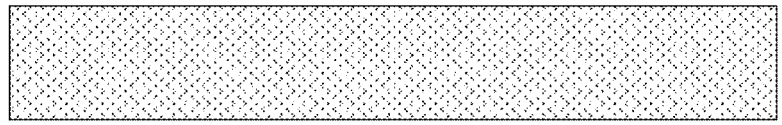
FIG. 4A

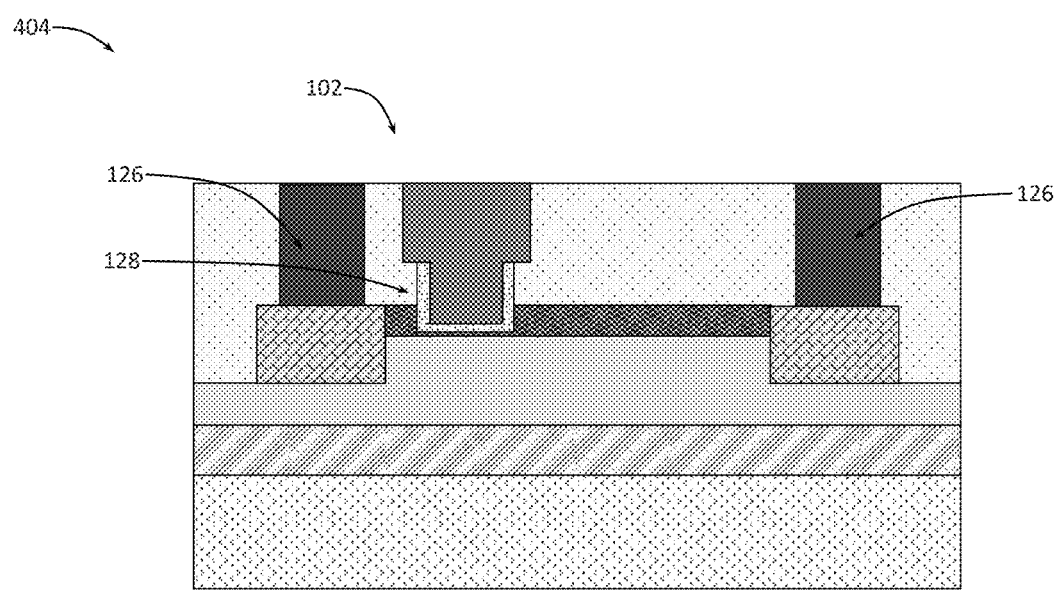
FIG. 4B
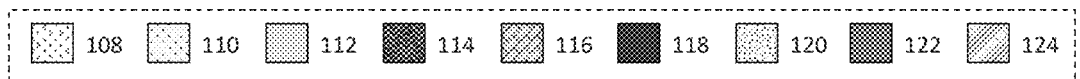

TRANSISTORS WITH ION- OR FIXED CHARGE-BASED FIELD PLATE STRUCTURES

BACKGROUND

Field-effect transistors (FETs) are devices that include a semiconductor channel material, as well as gate, drain, and source terminals. The conductivity between the drain and source terminals is controlled by an electric field in the device, which is generated by the voltage difference between the source and the gate of the device. Pairs of different terminals of the device are isolated with a suitable dielectric material.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 2 provides a cross-sectional side view illustrating an IC structure that includes an III-N transistor and multiple ion- or fixed charge-based field plate structures, according to other embodiments of the present disclosure.

FIGS. 4A-4B are various views illustrating different example stages in the manufacture of an IC structure that includes an III-N transistor and at least one ion- or fixed charge-based field plate structure using the method of FIG. 3, according to some embodiments of the present disclosure.

DETAILED DESCRIPTION

Overview

Figure 1:
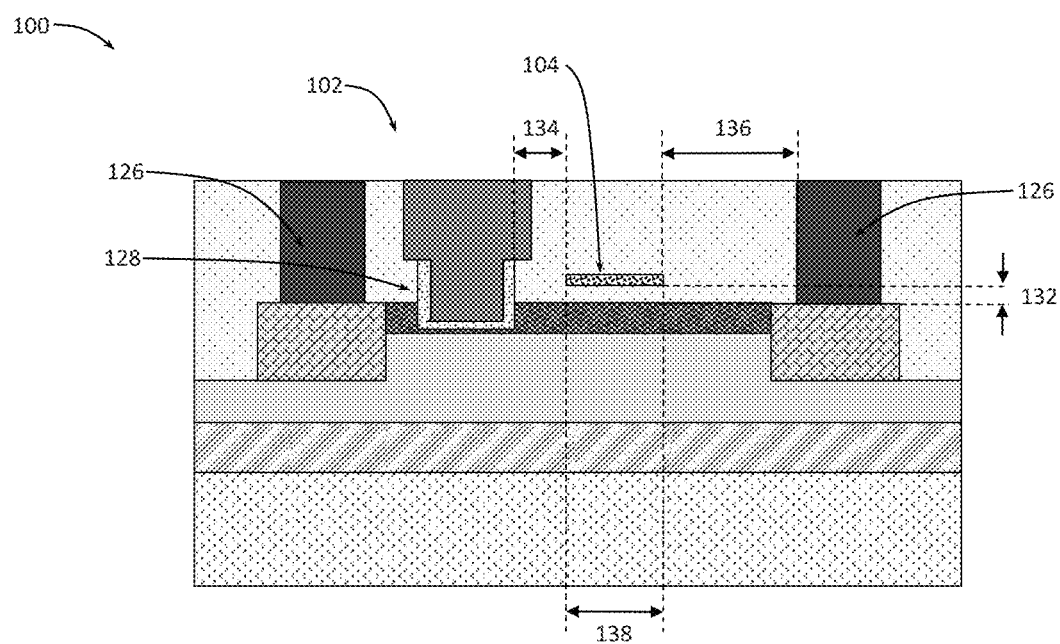
FIG. 1 provides a cross-sectional side view illustrating an integrated circuit (IC) structure that includes an III-N transistor and a single ion- or fixed charge-based field plate structure, according to some embodiments of the present disclosure.
Figure 1:
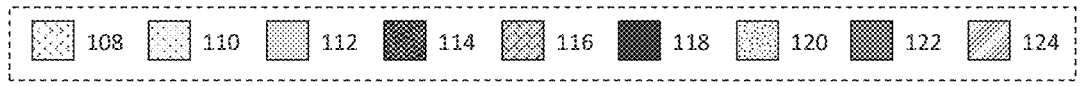

Solid-state devices that can be used in high voltage and/or high frequency applications are of great importance in modern semiconductor technologies. For example, radio frequency (RF) integrated circuits (RFIC) and power management ICs (PMIC) may be critical functional blocks in system on a chip (SoC) implementations. Such SoC implementations may be found in mobile computing platforms such as smartphones, tablets, laptops, netbooks, and the like. In such implementations, the RFIC and PMIC and RFIC are important factors for power efficiency and form factor, and can be equally or even more important than logic and memory circuits.

Due, in part, to their large band gap and high mobility, III-N material based transistors, such as gallium nitride (GaN) based transistors, may be particularly advantageous for high voltage and/or high frequency applications. For example, because GaN has a larger band gap (about 3.4 electronvolts (eV)) than silicon (Si; band gap of about 1.1 eV), a GaN transistor is expected to withstand a larger electric field (resulting, e.g., from applying a large voltage to the drain, Vdd) before suffering breakdown, compared to a Si transistor of similar dimensions. Furthermore, GaN transistors may advantageously employ a 2D electron gas (2DEG) (i.e., a group of electrons, an electron gas, free to move in two dimensions but tightly confined in the third dimension, e.g., a 2D sheet charge) as its transport channel, enabling high mobilities without using impurity dopants. For example, the 2D sheet charge may be formed at an abrupt heterojunction interface formed by deposition (e.g., epitaxial deposition), on GaN, of a charge-inducing film of a material having larger spontaneous and piezoelectric polarization, compared to GaN (such a film is generally referred to as a "polarization layer"). Providing a polarization layer on an III-N material such as GaN allows forming very high charge densities without intentionally added impurity dopants, which, in turn, enables high mobilities.

Despite the advantages, there are some challenges associated with III-N transistors which hinder their large-scale implementation. One such challenge resides in drain electric field concentrating at the edge of the gate and causing premature breakdown. To address this challenge, conventionally, a field plate in a form of a metal layers is built into a transistor structure, to manipulate the distribution of electric field at the transistor drain and thereby enhance the breakdown voltage of the transistor. Such an approach may limit the design freedom in controlling the electric field and may incur large parasitic capacitance, especially if wider, longer, and thicker metal layers are used as field plates.

Disclosed herein are IC structures, packages, and device assemblies that use ions or fixed charges (i.e., charges which are not mobile) to create field plate structures which are embedded in a dielectric material between gate and drain electrodes of a transistor. Embodiments of the present disclosure are based on recognition that ion- or fixed charge-based field plate structures may provide viable approaches to changing the distribution of electric field at a transistor drain to increase the breakdown voltage of a transistor without incurring the large parasitic capacitances associated with the use of metal field plates.

In one aspect of the present disclosure, an IC structure is provided, the IC structure including a support structure/material (which may be, e.g., a substrate, a die, or a chip), and a transistor provided over, or at least partially in, the support structure. The transistor includes a channel material, and gate and drain electrodes. The IC structure further includes a dielectric material, provided between the gate electrode and the drain electrode, above the channel material (i.e., the channel material is between the dielectric material and a substrate), and a region within the dielectric material, between the gate electrode and the drain electrode, that includes a plurality of deliberately added ions (i.e., the region is an ion-based region) or/and a plurality of deliberately added fixed charges (i.e., the region is a fixed charge-based region). As used herein, "deliberately added" ions or fixed charges refers to the fact that the ions or fixed charges are in concentrations which are higher than concentrations of whichever unintentional ions or fixed charges may be present in the IC structure. Such deliberately added ion- or fixed charge-based regions enclosed in the dielectric material between the drain and the gate electrodes of the transistor may realize ion- or fixed charge-based field plate structures. In further embodiments, the IC structure may include multiple such ion- or fixed charge-based field plate structures, e.g., to enable more nuanced control of the drain electric field. Furthermore, in some embodiments, the IC structure may also include one or more metal field plates to further control the drain electric field and the breakdown voltage of the transistor.

As used herein, the term "III-N material" refers to a compound semiconductor material with a first sub-lattice of at least one element from group III of the periodic table (e.g., Al, Ga, In) and a second sub-lattice of nitrogen (N). As used herein, the term "III-N device" (e.g., an III-N transistor) refers to a device that includes an III-N material (which may include one or more different III-N materials, e.g., a plurality of different III-N materials stacked over one another) as an active material.

While various embodiments described herein refer to III-N transistors (i.e., transistors employing one or more III-N materials as an active channel material), these embodiments are equally applicable to any other III-N devices besides III-N transistors, such as diodes, sensors, light-emitting diodes (LEDs), and lasers (i.e., other device components employing one or more III-N materials as active materials). Furthermore, while the following discussions may refer to the two-dimensional charge carrier layers as "2DEG" layers, embodiments described herein are also applicable to systems and material combinations in which 2D hole gas (2DHG) may be formed, instead of 2DEG. Thus, unless stated otherwise, embodiments referring to 2DEG are equally applicable to implementing 2DHG instead, all of such embodiments being within the scope of the present disclosure.

Each of the structures, packages, methods, devices, and systems of the present disclosure may have several innovative aspects, no single one of which being solely responsible for the all of the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art. For example, the term "connected" means a direct electrical or magnetic connection between the things that are connected, without any intermediary devices, while the term "coupled" means either a direct electrical or magnetic connection between the things that are connected, or an indirect connection through one or more passive or active intermediary devices. The term "circuit" means one or more passive and/or active components that are arranged to cooperate with one another to provide a desired function. If used, the terms "oxide," "carbide," "nitride," etc. refer to compounds containing, respectively, oxygen, carbon, nitrogen, etc. Similarly, the terms naming various compounds refer to materials having any combination of the individual elements within a compound (e.g., "gallium nitride" or "GaN" refers to a material that includes gallium and nitrogen, "aluminum indium gallium nitride" or "AlInGaN" refers to a material that includes aluminum, indium, gallium and nitrogen, and so on). Further, the term "high-k dielectric" refers to a material having a higher dielectric constant (k) than silicon oxide, while the term "low-k dielectric" refers to a material having a lower k than silicon oxide. The terms "substantially," "close," "approximately," "near," and "about," generally refer to being within +/−20%, preferably within +/−10%, of a target value based on the context of a particular value as described herein or as known in the art. Similarly, terms indicating orientation of various elements, e.g., "coplanar," "perpendicular," "orthogonal," "parallel," or any other angle between the elements, generally refer to being within +/−5-20% of a target value based on the context of a particular value as described herein or as known in the art.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. As used herein, the notation "A/B/C" means (A), (B), and/or (C).

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. The accompanying drawings are not necessarily drawn to scale. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense. For convenience, if a collection of drawings designated with different letters are present, e.g., FIGS. 5A-5B, such a collection may be referred to herein without the letters, e.g., as "FIG. 5." In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated.

In the drawings, some schematic illustrations of example structures of various structures, devices, and assemblies described herein may be shown with precise right angles and straight lines, but it is to be understood that such schematic illustrations may not reflect real-life process limitations which may cause the features to not look so "ideal" when any of the structures described herein are examined using e.g., scanning electron microscopy (SEM) images or transmission electron microscope (TEM) images. In such images of real structures, possible processing defects could also be visible, e.g., not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication.

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Various IC structures that include one or more ion- or fixed charge-based field plate structures embedded in a dielectric material between gate and drain electrodes of a transistor as described herein may be implemented in one or more components associated with an IC or/and between various such components. In various embodiments, components associated with an IC Include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. In some embodiments, IC structures as described herein may be included in a RFIC, which may, e.g., be included in any component associated with an IC of an RF receiver, an RF transmitter, or an RF transceiver, e.g., as used in telecommunications within base stations (BS) or user equipment (UE). Such components may include, but are not limited to, power amplifiers, low-noise amplifiers, RF filters (including arrays of RF filters, or RF filter banks), switches, upconverters, downconverters, and duplexers. In some embodiments, the IC structures as described herein may be employed as part of a chipset for executing one or more related functions in a computer.

Integrating Ion- or Fixed Charge-Based Field Plate Structures with/in a Transistor FIG. 1 provides a cross-sectional side view illustrating an IC structure 100 that includes an III-N transistor 102 integrated with an ion- or a fixed charge-based field plate structure 104, according to some embodiments of the present disclosure. A legend provided within a dashed box at the bottom of FIG. 1 illustrates colors/patterns used to indicate some classes of materials of some of the elements shown in FIG. 1, so that FIG. 1 is not cluttered by too many reference numerals. For example, FIG. 1 uses different colors/patterns to identify a support structure 108 (which may be referred to, interchangeably, as a "substrate 108"), an insulator 110, an III-N channel material 112, a polarization material 114, source/drain (S/D) regions 116 of the III-N transistor 102, an electrically conductive material 118 used to implement contacts (electrodes) to the S/D regions 116, a gate dielectric material 120 of the III-N transistor 102, a gate electrode material 122, and a buffer material 124.

The support structure 108 may be any suitable structure, e.g., a substrate, a die, or a chip, on which transistors and ion- or fixed charge-based field plate structures as described herein may be implemented. In some embodiments, the support structure 108 may include a semiconductor, such as silicon. In other implementations, the support structure 108 may include/be alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N or group IV materials.

In some embodiments, the support structure 103 may include a ceramic material, or any other non-semiconductor material. For example, in some embodiments, the support structure 108 may include glass, a combination of organic and inorganic materials, embedded portions having different materials, etc. Although a few examples of materials from which the support structure may be formed are described here, any material that may serve as a foundation upon which transistors and on or fixed charge-based field plate structures as described herein may be implemented as described herein may be built falls within the spirit and scope of the present disclosure.

Although not specifically shown in FIG. 1, in some embodiments, the support structure 108 of the IC structure 100 may include an insulating layer, such as an oxide isolation layer, provided thereon. For example, in some embodiments, a layer of the insulator 110 may be provided over the support structure 108 (not shown in FIG. 1). The insulator 110 may include any suitable insulating material, e.g., any suitable interlayer dielectric (ILD), to electrically isolate the semiconductor material of the support structure 108 from other regions of or surrounding the III-N transistor 102. Providing such an insulating layer over the support structure 108 may help mitigate the likelihood that conductive pathways will form through the support structure 108 (e.g., a conductive pathway between the S/D regions 116). Examples of the insulator 110 may include, in some embodiments, silicon oxide, silicon nitride, aluminum oxide, and/or silicon oxynitride.

In some embodiments, the support structure 108 may include a ceramic material, or any other non-semiconductor material. Although a few examples of materials from which the support structure 108 may be formed are described here, any material that may serve as a foundation upon which at least one ion- or fixed charge-based field plate structure and at least one transistor as described herein may be built falls within the spirit and scope of the present disclosure.

In some embodiments, the III-N channel material 112 may be formed of a compound semiconductor with a first sub-lattice of at least one element from group III of the periodic table (e.g., Al, Ga, In), and a second sub-lattice of nitrogen (N). In some embodiments, the III-N channel material 112 may be a binary, ternary, or quaternary III-N compound semiconductor that is an alloy of two, three, or even four elements from group III of the periodic table (e.g., boron, aluminum, indium, gallium) and nitrogen.

In general, the III-N channel material 112 may be composed of various III-N semiconductor material systems including, for example, N-type or P-type III-N materials systems, depending on whether the III-N transistor 102 is an N-type or a P-type transistor. For some N-type transistor embodiments, the III-N channel material 112 may advantageously be an III-N material having a high electron mobility, such a, but not limited to GaN, InGaAs, InP, InSb, and InAs. For some $In_xGa_{1-x}As$ embodiments, in content (x) may be between 0.6 and 0.9, and advantageously is at least 0.7 (e.g., $In_{0.7}Ga_{0.3}As$). For some such embodiments, the III-N channel material 112 may be a ternary III-N alloy, such as InGaN, or a quaternary III-N alloy, such as AlInGaN.

In some embodiments, the III-N channel material 112 may be formed of a highly crystalline semiconductor, e.g., of substantially a monocrystalline semiconductor (possibly with some limited amount of defects, e.g., dislocations). The quality of the III-N channel material 112 (e.g., in terms of defects or crystallinity) may be higher than that of other III-N materials of, or near, the III-N transistor 102 since, during the operation of the III-N transistor 102, a transistor channel will form in the III-N channel material 112.

In some embodiments, the III-N channel material 112 may be an intrinsic III-N semiconductor material or alloy, not intentionally doped with any electrically active impurity. In alternate embodiments, one or more a nominal impurity dopant level may be present within the III-N channel material 112, for example to set a threshold voltage Vt of the III-N transistor 102, or to provide halo pocket implants etc. In such impurity-doped embodiments however, impurity dopant level within the III-N channel material 112 may be relatively low, for example below $10^{15}$ dopants per cubic centimeter ($cm^{-3}$), or below $10^{13}$ $cm^{-3}$.

In various embodiments, a thickness of the III-N channel material 112 may be between about 5 and 2000 nanometers, including all values and ranges therein, e.g., between about 50 and 1000 nanometers, or between about 10 and 50 nanometers. Unless specified otherwise, all thicknesses described herein refer to a dimension measured in a direction perpendicular to the support structure 108.

Turning now to the polarization material 114 of the III-N transistor 102, in general, the polarization material 114 may be a layer of a charge-inducing film of a material having larger spontaneous and/or piezoelectric polarization than that of the bulk of the III-N layer material immediately below it (e.g., the III-N channel material 112), creating a heterojunction (i.e., an interface that occurs between two layers or regions of semiconductors having unequal band gaps) with the III-N channel material 112, and leading to formation of 2DEG at or near (e.g., immediately below) that interface, during operation of the III-N transistor 102. As described above, a 2DEG layer may be formed during operation of an III-N transistor in a layer of an III-N semiconductor material immediately below a suitable polarization layer. In various embodiments, the polarization material 114 may include materials such as AlN, InAlN, AlGaN, or $Al_xIn_yGa_{1-x-y}N$, and may have a thickness between about 1 and 50 nanometers, including all values and ranges therein, e.g., between about 5 and 15 nanometers or between about 10 and 30 nanometers.

As also shown in FIG. 1, the transistor 102 may include two S/D regions 116, where one of the S/D regions 116 is a source region and another one is a drain region, where the "source" and the "drain" designations may be interchangeable. As is well-known, in a transistor, S/D regions (also sometimes interchangeably referred to as "diffusion regions") are regions that can supply charge carriers for the transistor channel (e.g., the transistor channel 112) of the transistor (e.g., the transistor 102). In some embodiments, the S/D regions 116 may include highly doped semiconductor materials, such as highly doped InGaN. Often, the S/D regions may be highly doped, e.g., with dopant concentrations of at least above $1·10^{21}$ $cm^{-3}$, in order to advantageously form Ohmic contacts with the respective S/D electrodes of the transistor 102 (e.g., electrodes 126 shown in FIG. 1, made of the electrically conductive material 118), although these regions may also have lower dopant concentrations in some implementations. Regardless of the exact doping levels, the S/D regions 116 are the regions having dopant concentration higher than in other regions between the source region (e.g., the S/D region 116 shown on the left side in FIG. 1) and the drain region (e.g., the S/D region 116 shown on the right side in FIG. 1), i.e., higher than the channel material 112. For that reason, sometimes the S/D regions are referred to as highly doped (HD) S/D regions. In further embodiments, one or more layers of metal and/or metal alloys may be used to form the S/D regions 116.

The electrically conductive material 118 of the S/D electrodes 126 may include any suitable electrically conductive material, alloy, or a stack of multiple electrically conductive materials. In some embodiments, the S/D electrodes 126 may include one or more metals or metal alloys, with metals such as copper, ruthenium, palladium, platinum, cobalt, nickel, hafnium, zirconium, titanium, tantalum, and aluminum, tantalum nitride, titanium nitride, tungsten, doped silicon, doped germanium, or alloys and mixtures of these. In some embodiments, the S/D electrodes 126 may include one or more electrically conductive alloys, oxides, or carbides of one or more metals. In some embodiments, the S/D electrodes 126 may include a doped semiconductor, such as silicon or another semiconductor doped with an N-type dopant or a P-type dopant. Metals may provide higher conductivity, while doped semiconductors may be easier to pattern during fabrication. In some embodiments, the S/D electrodes 126 may have a thickness between about 2 nanometers and 1000 nanometers, preferably between about 2 nanometers and 100 nanometers.

FIG. 1 further illustrates a gate stack 128 provided over a channel portion of the III-N channel material 112. The gate stack 128 includes a layer of a gate dielectric material 120, and a gate electrode material 122.

The gate dielectric material 120 is typically a high-k dielectric material, e.g., a material including elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric material 120 may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric material 120 during manufacture of the III-N transistor 102 to improve the quality of the gate dielectric material 120. A thickness of the gate dielectric material 120 may be between 0.5 nanometers and 3 nanometers, including all values and ranges therein, e.g., between 1 and 3 nanometers, or between 1 and 2 nanometers.

The gate electrode material 122 may include at least one P-type work function metal or N-type work function metal, depending on whether the transistor 102 is a PMOS transistor or an NMOS transistor (e.g., P-type work function metal may be used as the gate electrode material 122 when the transistors 102 is a PMOS transistor and N-type work function metal may be used as the gate electrode material 122 when the transistor 102 is an NMOS transistor, depending on the desired threshold voltage). For a PMOS transistor, metals that may be used for the gate electrode material 122 may include, but are not limited to, ruthenium, palladium, platinum, cobalt, nickel, titanium nitride, and conductive metal oxides (e.g., ruthenium oxide). For an NMOS transistor, metals that may be used for the gate electrode material 122 include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and nitrides of these metals (e.g., tantalum nitride, and tantalum aluminum nitride). In some embodiments, the gate electrode material 122 may include a stack of two or more metal layers, where one or more metal layers are work function metal layers and at least one metal layer is a fill metal layer.

Further layers may be included next to the gate electrode material 122 for other purposes, such as to act as a diffusion barrier layer or/and an adhesion layer, not specifically shown in FIG. 1. Furthermore, in some embodiments, the gate dielectric material 120 and the gate electrode material 122 may be surrounded by a gate spacer, not shown in FIG. 1, configured to provide separation between the gates of different transistors. Such a gate spacer may be made of a low-k dielectric material (i.e., a dielectric material that has a lower dielectric constant (k) than silicon dioxide which has a dielectric constant of 3.9). Examples of low-k materials that may be used as the dielectric gate spacer may include, but are not limited to, fluorine-doped silicon dioxide, carbon-doped silicon dioxide, spin-on organic polymeric dielectrics such as polyimide, polynorbornenes, benzocyclobutene, and polytetrafluoroethylene (PTFE), or spin-on silicon-based polymeric dielectric such as hydrogen silsesquioxane (HSQ) and methylsilsesquioxane (MSQ)). Other examples of low-k materials that may be used as the dielectric gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1.

In some embodiments, the III-N transistor 102 may, optionally, include a buffer material 124 between the III-N channel material 112 and the support structure 108. In some embodiments, the buffer material 124 may be a layer of a semiconductor material that has a band gap larger than that of the III-N channel material 112, so that the buffer material 124 can serve to prevent current leakage from the future III-N transistor to the support structure 108. A properly selected semiconductor for the buffer material 124 may also enable better epitaxy of the III-N channel material 112 thereon, e.g., it may improve epitaxial growth of the III-N channel material 112, for instance in terms of a bridge lattice constant or amount of defects. For example, a semiconductor that includes aluminum, gallium, and nitrogen (e.g., AlGaN) or a semiconductor that includes aluminum and nitrogen (e.g., AlN) may be used as the buffer material 124 when the III-N channel material 112 is a semiconductor that includes gallium and nitrogen (e.g., GaN). Other examples of materials for the buffer material 124 may include materials typically used as ILD, described above, such as oxide isolation layers, e.g., silicon oxide, silicon nitride, aluminum oxide, and/or silicon oxynitride. When implemented in the III-N transistor 102, the buffer material 124 may have a thickness between about 100 and 5000 nm, including all values and ranges therein, e.g., between about 200 and 1000 nanometers, or between about 250 and 500 nanometers.

Although not specifically shown in FIG. 1, the IC structure 100 may further include additional transistors similar to the III-N transistor 102, described above.

Turning now to the ion- or fixed charge-based field plate structure 104, FIG. 1 illustrates that the structure 104 may be embedded somewhere within the dielectric material of the insulator 110.

In general, an ion-based field plate structure 104 may refer to any region of the dielectric material of the insulator 110 that includes a plurality of ions, deliberately provided therein (e.g. deliberately implanted using ion implantation or provided using any other suitable technique, as opposed to accidental trace ions that may be present in any material). In various embodiments, concentration of the ions in such a region may be at least about $10^{16}$ ions per cubic centimeter ($cm^{-3}$), e.g., at least about $10^{18}$ $cm^{-3}$. Any upper limits which may, but do not have to be, discussed with reference to the on concentration of the structure 104 may be determined by what is practically possible to implant, e.g., around $10^{21}$ $cm^{-3}$. In various embodiments, the plurality of ions implanted into the insulator 110 to form the ion-based field plate structure 104 may be anions (i.e., negative ions), such as, but not limited to, fluorine ions. In various embodiments, the ion-based field plate structure 104 may be electrically floating, i.e., not connected to any potential or ground.

In general, a fixed charge-based field plate structure 104 may refer to any region of the dielectric material of the insulator 110 that includes a plurality of fixed charges, deliberately provided therein (e.g. deliberately deposited, as opposed to accidental trace fixed charges that may be present in any material). In various embodiments, concentration of the fixed charges in such a region may be at least about $10^{16}$ fixed charges $cm^{-3}$, e.g., at least about $10^{18}$ $cm^{-3}$. Any upper limits which may, but do not have to be, discussed with reference to the fixed charge concentration of the structure 104 may be determined by what is practically possible to deposit, e.g., around $10^{21}$ $cm^{-3}$. In various embodiments, the plurality of fixed charges enclosed in the insulator 110 to form the fixed charge-based field plate structure 104 may be negative fixed charges. In various embodiments, the fixed charge-based field plate structure 104 may be electrically floating, i.e., not connected to any potential or ground.

In some embodiments, the ions of fixed charges may form a layer, where, in this context, a layer refers to a region where substantial majority of ions or fixed charges may be concentrated. The "layer" of implanted ions or fixed charges is illustrated in FIG. 1 with the structure 104 being depicted as having clear boundaries. In real-life, the structure 104 may not have such clear boundaries due to some ions or fixed charges being provided somewhat deeper and some ions or fixed charges being provided somewhat shallower than may be intended. Thus, in other embodiments, the structure 104 may not have such a perfect shape as shown in FIG. 1. In other words, some ions or fixed charges may be provided outside of what is considered to be a "layer," e.g., because ions or fixed charges may diffuse further into the dielectric material, but the term "layer" may refer to the region of a certain levels of concentration of the ions or fixed charges, e.g., the concentration levels described above. In some embodiments, a thickness of such a layer of ions or fixed charges (i.e., a dimension measured in a direction perpendicular to the support structure 108) may be between 3 and 50 nanometers, e.g., between about 3 and 15 nanometers.

In some embodiments, the ion- or fixed charge-based field plate structure 104 may be embedded in the dielectric material of the insulator 110, i.e., surrounded by the dielectric material on all sides. In such embodiments, a thickness of the dielectric material of the insulator 110 between the layer of ions or fixed charges of the structure 104 and the semiconductor material under the insulator 110 (e.g., the polarization material 114 in case the transistor 102 is an III-N transistor, or any channel material in case the transistor 102 is not an III-N transistor and polarization material 114 is absent), labeled in FIG. 1 as a distance 132, may be between about 1 and 100 nanometers, e.g., between about 5 and 30 nanometers. As shown in FIG. 1, in some embodiments, the ion- or fixed charge-based field plate structure 104 may be provided at a distance to the gate electrode and the drain electrode in between which the structure 104 is located. In some such embodiments, a distance from the layer of ions or fixed charges of the structure 104 to the corresponding gate electrode, labeled in FIG. 1 as a distance 134, may be between about 10 and 2000 nanometers, e.g., between about 20 and 500 nanometers. Furthermore, in some such embodiments, a distance from the layer of ions or fixed charges of the structure 104 to the corresponding drain electrode, labeled in FIG. 1 as a distance 136, may be about 10 and 2000 nanometers, e.g., between about 20 and 500 nanometers. In various embodiments, the distance 134 may be the same or different than the distance 136. In some embodiments, a length of the layer of ions or fixed charges of the structure 104 (i.e., a dimension measured in a direction parallel to a line connecting the gate electrode and the drain electrode), labeled in FIG. 1 as a distance 138, may be between 10 and 2000 nanometers, e.g., between about 25 and 1000 nanometers.

In other embodiments, multiple ion- or fixed charge-based field plate structures 104 may be embedded in the dielectric material between the gate and the drain electrode of the transistor 102. An example of such an embodiment is shown in FIG. 2, providing a cross-sectional side view illustrating a modified version of the IC structure 100, according to some embodiments of the present disclosure. The IC structure 100 shown in FIG. 2 is similar to the IC structure 100 shown in FIG. 1 and, therefore, descriptions provided with reference to FIG. 1 are applicable to the IC structure 100 of FIG. 2 and, in the interests of brevity, are not repeated here. Instead, only the differences are described.

As shown in FIG. 2, in some embodiments, multiple instances of the ion- or fixed charge-based field plate structures 104 as described above may be included in the insulator 110—shown in the example of FIG. 2 as a first ion- or fixed charge-based field plate structure 104-1 and a second ion- or fixed charge-based field plate structure 104-2. Descriptions provided above with reference to the ion- or fixed charge-based field plate structure 104 are applicable to each of these two structures and, therefore, in the interests of brevity are not repeated.

In some embodiments, a thickness of the dielectric material between the first and second ion- or fixed charge-based field plate structures 104, a dimension labeled in FIG. 2 as a distance 140, may be between about 0 and 50 nanometers, preferably between about 5 and 35 nanometers.

In some embodiments, multiple instances of the ion- or fixed charge-based field plate structures 104 may be implemented in different layers above the support structure 108, i.e., at different distances from the support structure 108 or from the channel material of the transistor 102. In such embodiments, when discussing relative positions of such ion- or fixed charge-based field plate structures 104 with respect to one another, their geometrical projections on some common plane may be discussed. For example, in some embodiments, a projection of the second ion- or fixed charge-based field plate structure 104-2 onto a plane of the channel material 112 or a plane of the support structure 108 may at least partially overlap with a projection of the first ion- or fixed charge-based field plate structure 104-1 onto the same plane, as shown in FIG. 2. Thus, in some embodiments, one layer of implanted ions of fixed charges (the layer of the structure 104-2 shown in FIG. 2) may be stacked over another layer of implanted ions or fixed charges (the layer of the structure 104-1 shown in FIG. 1), but with an offset. In other embodiments, such projections do not have to overlap (not specifically shown in the present figures). In other words, in some embodiments, different layers of ions or fixed charges (i.e., different instances of the ion- or fixed charge-based field plate structures 104) may be in different planes above the support structure 108, but arranged so that their projections do not overlap, i.e., arranged so that they are provided over different portions of the channel material 112). In still other embodiments, also not specifically shown in the present figures, different layers of ions or fixed charges (i.e., different instances of the ion- or fixed charge-based field plate structures 104) may be in substantially the same plane above the support structure 108, and arranged so that their projections do not overlap, i.e., arranged so that they are provided over different portions of the channel material 112.

Although not specifically shown in FIGS. 1-2, the IC structure 100 may further include additional ion- or fixed charge-based field plate structures similar to the ion- or fixed charge-based field plate structures 104, described above. Furthermore, in some embodiments, the IC structure 100 may also include one or more metal field plate structures (not specifically shown in the present figures), e.g., to provide additional means of varying the drain electric field.

In some embodiments, the IC structure 100 may be included in, or used to implement at least a portion of an RF FE. In some embodiments, especially when the transistor 102 is an III-N transistor, the transistor 102 of the IC structure 100 may be included in, or used to implement at least a portion of an RF circuit or a part of a power circuit included in the IC structure.

The IC structures 100 illustrated in FIGS. 1-2 do not represent an exhaustive set of assemblies in which one or more ion- or fixed charge-based field plate structures may be embedded in a dielectric material between gate and drain electrodes of a transistor, as described herein, but merely provide examples of such structures/assemblies. Although particular arrangements of materials are discussed with reference to FIGS. 1-2, intermediate materials may be included in various portions of these figures. Note that FIGS.

1-2 are intended to show relative arrangements of some of the components therein, and that various device components of these figures may include other components that are not specifically illustrated, e.g., various interfacial layers or various additional layers or elements.

For example, although not specifically shown, the IC structure 100 may include a solder resist material (e.g., polyimide or similar material) and one or more bond pads formed on upper-most interconnect layer of the IC structure, e.g., at the top of the IC structure 100 shown in FIG. 1 or in FIG. 2. The bond pads may be electrically coupled with a further interconnect structure and configured to route the electrical signals between the transistor 102 and other external devices. For example, solder bonds may be formed on the one or more bond pads to mechanically and/or electrically couple a chip including the IC structure 100 with another component (e.g., a circuit board). The IC structure 100 may have other alternative configurations to route the electrical signals from the interconnect layers, e.g., the bond pads described above may be replaced by or may further include other analogous features (e.g., posts) that route the electrical signals to external components.

In another example, although also not specifically shown, the transistor 102 may be a FET other than an III-N transistor. In such embodiments, the channel material 112 may include any suitable semiconductor material including, for example, N-type or P-type materials, some examples of which are described below.

In some embodiments, the channel material 112 may be formed of a monocrystalline semiconductor. In some embodiments, the channel material 112 may be formed of a compound semiconductor with a first sub-lattice of at least one element from group III of the periodic table (e.g., Al, Ga, In), and a second sub-lattice of at least one element of group V of the periodic table (e.g., P, As, Sb). In some embodiments, the channel material 112 may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For exemplary P-type transistor embodiments, the channel material 112 may advantageously be a group IV material having a high hole mobility, such as, but not limited to, Ge or a Ge rich SiGe alloy. For some exemplary embodiments, the channel material 112 may have a Ge content between 0.6 and 0.9, and advantageously is at least 0.7.

For exemplary N-type transistor embodiments, the channel material 112 may advantageously be an III-V material having a high electron mobility, such as, but not limited to InGaAs, InP, InSb, and InAs. For some such embodiments, the channel material 112 may be a ternary III-V alloy, such as InGaAs or GaAsSb. For some $In_xGa_{1-x}As$ fin embodiments, in content in the channel material 112 may be between 0.6 and 0.9, and advantageously at least 0.7 (e.g., $In_{0.7}Ga_{0.3}As$).

In some embodiments, the channel material 112 may include a high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide.

In some embodiments, the channel material 112 may be an intrinsic III-V or IV semiconductor material or alloy, not intentionally doped with any electrically active impurity. In alternate embodiments, nominal impurity dopant levels may be present within the channel material 112, for example to set a threshold voltage Vt, or to provide HALO pocket implants, etc. In such impurity-doped embodiments however, impurity dopant level within the channel material 112 may be relatively low, for example below about $10^{15}$ cm$^{-3}$, and advantageously below $10^{13}$ cm$^{-3}$.

In some embodiments, the transistor 102 may be a thin film transistor (TFT). A TFT is a special kind of a FET, made by depositing a thin film of an active semiconductor material, as well as a dielectric layer and metallic contacts, over a supporting layer that may be a non-conducting layer. During operation of the TFT, at least a portion of the active semiconductor material forms a channel of the TFT, and, therefore, the thin film of such active semiconductor material is referred to herein as a "TFT channel material." This is different from conventional, non-TFT, silicon transistors where the active semiconductor channel material is typically a part of a semiconductor substrate, e.g., a part of a silicon wafer. In case the transistor 102 of the IC structure 100 is a TFT, the channel material 112 may include a high mobility oxide semiconductor material, such as tin oxide, antimony oxide, indium oxide, indium tin oxide, titanium oxide, zinc oxide, indium zinc oxide, IGZO, gallium oxide, titanium oxynitride, ruthenium oxide, or tungsten oxide. In general, the channel material 112 may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. In particular, the channel material 112 may be formed of a thin film material. Some such materials may be deposited at relatively low temperatures, which allows depositing them within the thermal budgets that avoid damaging other components. In some embodiments, the channel material 112 may have a thickness between about 5 and 30 nanometers, including all values and ranges therein.

In all such embodiments where the channel material 112 is not an III-N semiconductor material, a modified version of the IC structure 100 depicted in FIGS. 1-2 may not include the polarization material 114, and may not include the buffer material 124 (although, in some embodiments, a layer of another material serving different purposes may be present instead), and the channel material 112 could be a part of the support structure 108.

Additionally, although some elements of the IC structures are illustrated in FIGS. 1-2 as being planar rectangles or formed of rectangular solids, this is simply for ease of illustration, and embodiments of various ones of these elements may be curved, rounded, or otherwise irregularly shaped as dictated by, and sometimes inevitable due to, the manufacturing processes used to fabricate semiconductor device assemblies. For example, while FIGS. 1-2 may illustrate various elements, e.g., the S/D regions 116, the S/D electrodes 126, etc., as having perfectly straight sidewall profiles, i.e., profiles where the sidewalls extend perpendicularly to the support structure 108, these idealistic profiles may not always be achievable in real-world manufacturing processes. Namely, while designed to have straight sidewall profiles, real-world openings which may be formed as a part of fabricating various elements of the IC structures shown in FIGS. 1-2 may end up having either so-called "re-entrant" profiles, where the width at the top of the opening is smaller than the width at the bottom of the opening, or "non-re-entrant" profile, where the width at the top of the opening is larger than the width at the bottom of the opening. Oftentimes, as a result of a real-world opening not having perfectly straight sidewalls, imperfections may form within the materials filling the opening. For example, typical for re-entrant profiles, a void may be formed in the center of the opening, where the growth of a given material filling the opening pinches off at the top of the opening. Therefore, descriptions of various embodiments of integrating one or more ion- or fixed charge-based field plate structures with one or more transistors provided herein are equally applicable to embodiments where various elements of such integrated structures look different from those shown in the figures due to manufacturing processes used to form them.

Inspection of layout and mask data and reverse engineering of parts of a device to reconstruct the circuit using e.g., optical microscopy, TEM, or SEM, and/or inspection of a cross-section of a device to detect the shape and the location of various device elements described herein using e.g., Physical Failure Analysis (PFA) would allow determination of the integration of one or more ion- or fixed charge-based field plate structures with one or more transistors as described herein.

Figure 3:
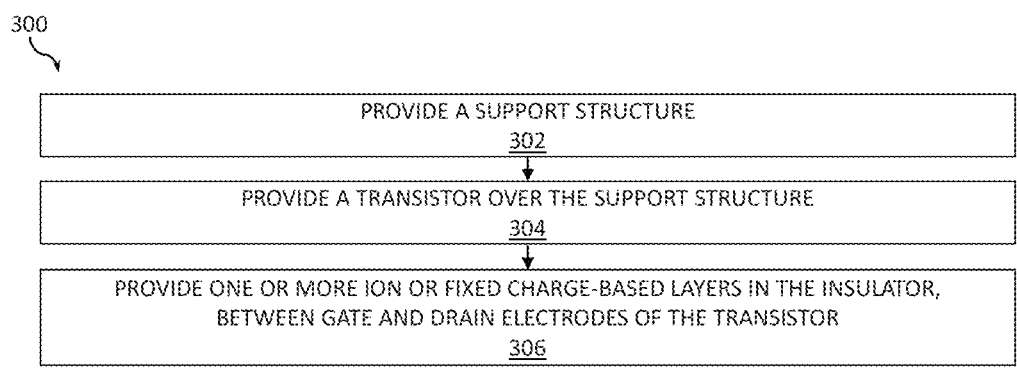
FIG. 3 is a flow diagram of an example method of manufacturing an IC structure that includes a transistor and at least one ion- or fixed charge-based field plate structure, in accordance with various embodiments of the present disclosure.
Figure 6:
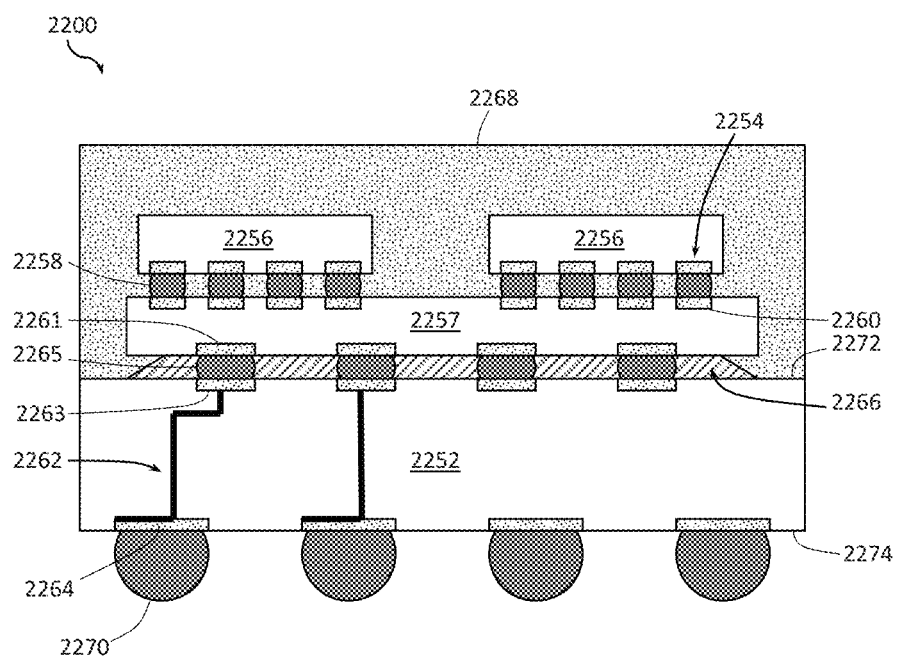
FIG. 6 is a cross-sectional side view of an IC package that may include one or more IC structures having one or more ion- or fixed charge-based field plate structures integrated with one or more transistors in accordance with any of the embodiments of the present disclosure.
Figure 7:
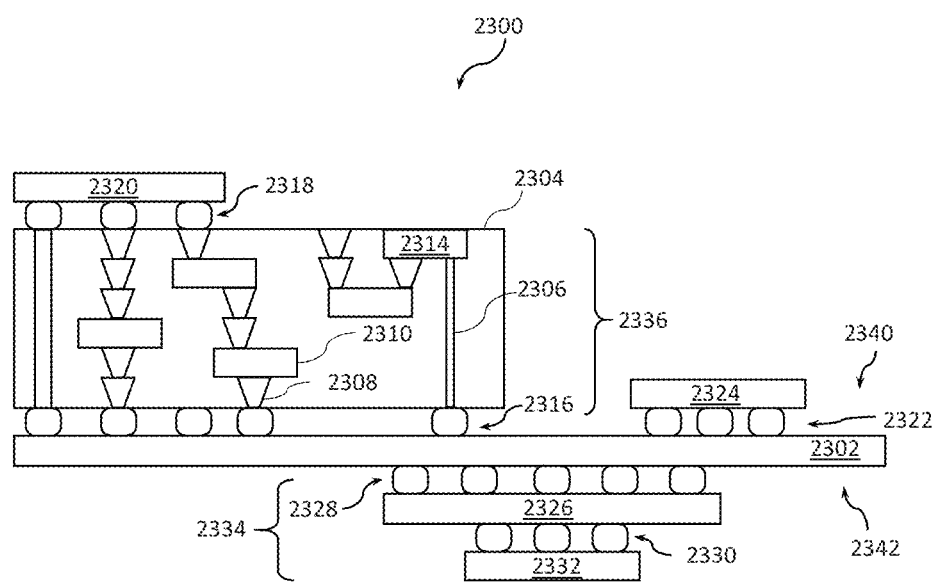
FIG. 7 is a cross-sectional side view of an IC device assembly that may include one or more IC structures having one or more ion- or fixed charge-based field plate structures integrated with one or more transistors in accordance with any of the embodiments of the present disclosure.
Figure 8:
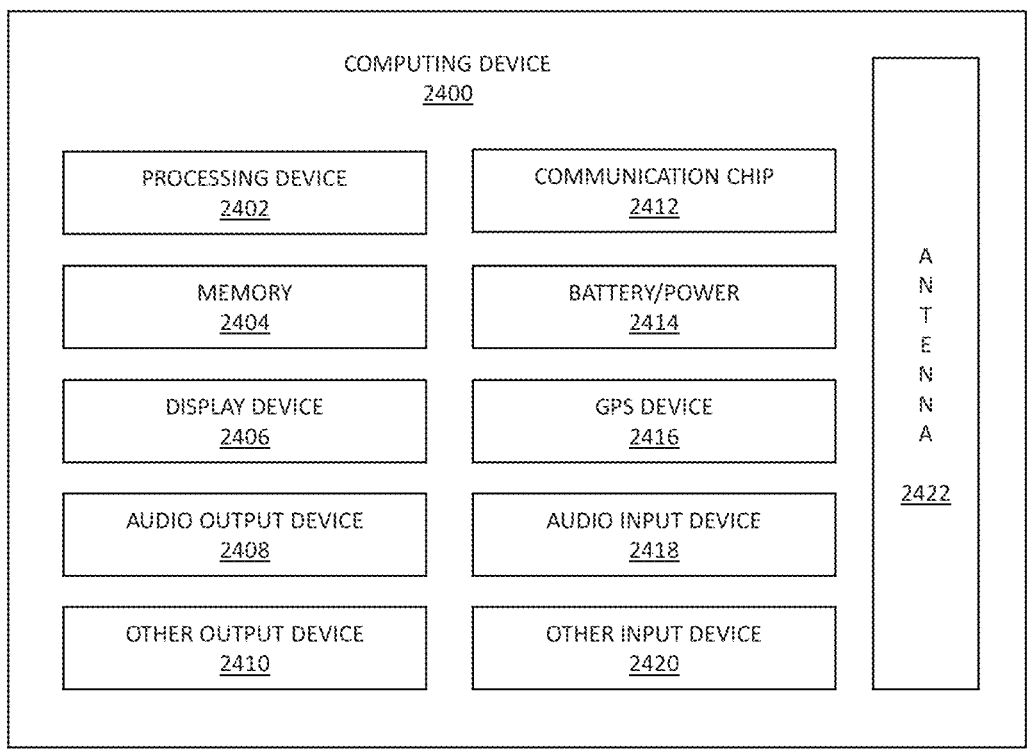
FIG. 8 is a block diagram of an example computing device that may include one or more IC structures having one or more on or fixed charge-based field plate structures integrated with one or more transistors in accordance with any of the embodiments of the present disclosure.

Manufacturing Transistors with Ion- or Fixed Charge-Based Field Plate Structures The IC structures implementing one or more ion- or fixed charge-based field plate structures integrated with one or more transistors as described herein may be manufactured using any suitable techniques. FIG. 3 illustrates one example of such a method. However, other examples of manufacturing any of the IC structures described herein, as well as larger devices and assemblies that include such structures (e.g., as shown in FIGS. 6-8) are also within the scope of the present disclosure.

FIG. 3 is a flow diagram of an example method 300 of manufacturing an IC structure that includes a transistor and at least one ion- or fixed charge-based field plate structure, in accordance with various embodiments of the present disclosure.

Although the operations of the method 300 are illustrated once each and in a particular order, the operations may be performed in any suitable order and repeated as desired. For example, one or more operations may be performed in parallel to manufacture, substantially simultaneously, multiple ion- or fixed charge-based field plate structures and/or multiple transistors as described herein. In another example, the operations may be performed in a different order to reflect the structure of a particular device assembly in which one or more ion- or fixed charge-based field plate structures integrated with one or more transistors as described herein will be included.

In addition, the example manufacturing method 300 may include other operations not specifically shown in FIG. 3, such as various cleaning or planarization operations as known in the art. For example, in some embodiments, the support structure 108, as well as layers of various other materials subsequently deposited thereon, may be cleaned prior to, after, or during any of the processes of the method 300 described herein, e.g., to remove oxides, surface-bound organic and metallic contaminants as well as subsurface contamination. In some embodiments, cleaning may be carded out using e.g., a chemical solutions (such as perox-ide), and/or with ultraviolet (UV) radiation combined with ozone, and/or oxidizing the surface (e.g., using thermal oxidation) then removing the oxide (e.g., using hydrofluoric acid (HF)). In another example, the structures/assemblies described herein may be planarized prior to, after, or during any of the processes of the method 300 described herein, e.g., to remove overburden or excess materials. In some embodiments, planarization may be carried out using either wet or dry planarization processes, e.g., planarization be a chemical mechanical planarization (CMP), which may be understood as a process that utilizes a polishing surface, an abrasive and a slurry to remove the overburden and planarize the surface.

Various operations of the method 300 may be illustrated with reference to the example embodiments shown in FIGS. 4A-4B, illustrating fabrication of an IC structure as shown in FIGS. 1-2, but the method 300 may be used to manufacture any suitable IC structures having one or more ion- or fixed charge-based field plate structures integrated with one or more transistors according to any embodiments described herein (e.g., when the transistor is not an III-N transistor). FIGS. 4A-4B illustrate cross-sectional side views similar to the view shown in FIG. 1, in various example stages in the manufacture of an IC structure using the method of FIG. 3 in accordance with some embodiments of the present disclosure.

The method 300 may begin with providing a support structure (process 302 shown in FIG. 3, a result of which is illustrated with an IC structure 402 shown in FIG. 4A). The IC structure 402 illustrates that the support structure provided in 302 may be the support structure 108 as described above.

The method 300 may then proceed with providing a transistor over the support structure provided in 302 (process 304 shown in FIG. 3, a result of which is illustrated with an IC structure 404 shown in FIG. 4B). The IC structure 404 illustrates that the transistor provided in 304 may be the III-N transistor 102 as described above. In various embodiments, process 304 may include any suitable deposition and patterning techniques for fabricating portions of the transistor 102.

For example, any suitable deposition techniques may be used to deposit the insulator 110, such as, but not limited to, spin-coating, dip-coating, atomic layer deposition (ALD), physical vapor deposition (PVD) (e.g., evaporative deposition, magnetron sputtering, or e-beam deposition), or CVD.

Examples of deposition techniques that may be used to provide various electrode materials include, but are not limited to, ALD, PVD (including sputtering), CVD, or electroplating.

The process 304 may also include epitaxially growing various transistor films for forming the future III-N transistor 102, e.g., for forming the buffer material 124, the channel material 112, and the polarization material 114. In this context, "epitaxial growth" refers to the deposition of crystalline overlayers in the form of the desired materials. The epitaxial growth of various layers of the process 304 may be carried out using any known gaseous or liquid precursors for forming the desired material layers.

Examples patterning techniques which may be used in 304 may include, but are not limited to, photolithographic or electron-beam (e-beam) patterning, possibly in conjunction with a suitable etching technique, e.g., a dry etch, such as RF reactive ion etch (RIE) or inductively coupled plasma (ICP) RIE. In various embodiments, any of the etches performed in 304 may include an anisotropic etch, using etchants in a form of e.g., chemically active ionized gas (i.e., plasma)

using e.g., bromine (Br) and chloride (Cl) based chemistries. In some embodiments, during any of the etches of the process 304, the IC structure may be heated to elevated temperatures, e.g., to temperatures between about room temperature and 200 degrees Celsius, including all values and ranges therein, to promote that byproducts of the etch are made sufficiently volatile to be removed from the surface.

The method 300 may then proceed with providing one or more ion- or fixed charge-based field plate structures in the insulator 110 between the gate and the drain electrodes of the transistor provided in 304 (process 306 shown in FIG. 3, a result of which is not illustrated in FIG. 4 because the result could be, e.g., the IC structure 100 shown in FIG. 1 or the IC structure 100 shown in FIG. 2).

In various embodiments where the one or more ion- or fixed charge-based field plate structures provided in 306 are ion-based field plate structures, process 306 may include any suitable ion implantation techniques known in the art for implanting desired ions into desired portions of the insulator 110. In some examples of such embodiments, process 306 may include implanting ions of a material (typically regarded as impurities) into another target material such as a semiconductor or dielectric material, to cause a change in the chemical and electrical properties of the target material and its surrounding materials. Ion implantation may involve an ion source, where ions of the desired species can be produced, and an accelerator, where the ions are electrostatically accelerated to a high energy to impinge on the target material. The species, dose and energy of the ions may be carefully selected to determine the functions acquired, concentration, and the depth of penetration of the ions in the target material.

In various embodiments where the one or more ion- or fixed charge-based field plate structures provided in 306 are fixed charge-based field plate structures, process 306 may include any suitable techniques known in the art for depositing desired fixed charges into desired portions of the insulator 110. In some examples of such embodiments, process 306 may include performing CVD or ALD with carefully selected deposition conditions. In some embodiments, deposition conditions that promote incorporation of negative fixed charges, e.g. in the form of native point defects or/and impurities, may include providing anion-rich environment in the reaction chamber of the CVD or ALD process, doping of the dielectric material being grown with negatively charged impurity atoms, and adding positively charged hydrogen atoms to the reaction chamber (i.e. providing hydrogen ambient growth). In some embodiments, providing anion-rich growth conditions may include ensuring that the partial pressure of anion precursor species in the reaction chamber is at or above a certain threshold, the threshold being provided either as an absolute value or a value relative to partial pressure of other gases in the chamber, e.g. of the cation precursor gases. In some embodiments, establishing anion-rich growth conditions may include ensuring that the partial pressure of the anion precursor gas/gases is greater than the partial pressure of the cation precursor gases. For example, the partial pressure of the anion precursor gas/gases may be between one and hundred times greater than the partial pressure of the cation precursor gases, including all values and ranges therein. For deposition of the negative fixed charge-based field plate structure as described herein, the anion precursor gases may include one or more of oxygen-containing precursors (e.g. oxygen gas, water, hydrogen peroxide, etc.), nitrogen-containing precursors (e.g. nitrogen gas, ammonia, nitrous oxide, etc.), or carbon-containing precursors (e.g. carbon dioxide, carbon monoxide, methane, etc.). Doping with impurity atoms that lead to negative fixed charge may be performed by in-situ doping during the CVD or ALD growth of the fixed charge layer. Impurity atoms that lead to negative fixed charge can be incorporated into the dielectric material being grown through introduction of impurity-level quantities of dopant-containing precursor gases during the growth, and controlled through the partial pressure of such gases. When the dielectric material of the fixed charge-based field plate structure is an oxide or a silicate, suitable dopant atoms to be provided in a dopant-containing precursor gas in process 306 may include, but are not limited to nitrogen, phosphorus, arsenic, etc (i.e. elements from the nitrogen group of the periodic table). When the dielectric material of the fixed charge-based field plate structure is a nitride, suitable dopant atoms to be provided in a dopant-containing precursor gas in process 3004 may include, but are not limited to carbon, silicon, germanium, etc (i.e. elements from the carbon group of the periodic table). When the dielectric material of the fixed charge-based field plate structure is a carbide, suitable dopant atoms to be provided in a dopant-containing precursor gas in process 3004 may include, but are not limited to boron, aluminum, gallium, etc (i.e. elements from the boron group of the periodic table).

Example Structures and Devices with Ion- or Fixed Charge-Based Field Plate Structures IC structures that include one or more ion- or fixed charge-based field plate structures integrated with one or more transistors as disclosed herein may be included in any suitable electronic device. FIGS. 5-8 illustrate various examples of devices and components that may include one or more ion- or fixed charge-based field plate structures integrated with one or more transistors as disclosed herein.

Figure 5A:
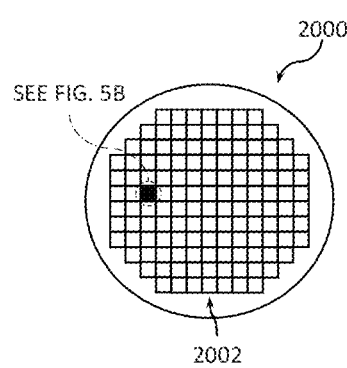
FIGS. 5A-5B are top views of a wafer and dies that include one or more IC structures having one or more ion- or fixed charge-based field plate structures integrated with one or more transistors in accordance with any of the embodiments of the present disclosure.
Figure 5B:
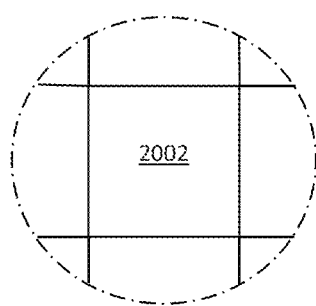

FIGS. 5A-5B are top views of a wafer 2000 and dies 2002 that may include one or more ion- or fixed charge-based field plate structures integrated with one or more transistors in accordance with any of the embodiments disclosed herein. In some embodiments, the dies 2002 may be included in an IC package, in accordance with any of the embodiments disclosed herein. For example, any of the dies 2002 may serve as any of the dies 2256 in an IC package 2200 shown in FIG. 6. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more ion- or fixed charge-based field plate structures integrated with one or more transistors as described herein). After the fabrication of the semiconductor product is complete (e.g., after manufacture of one or more ion- or fixed charge-based field plate structures integrated with one or more transistors as described herein, e.g., after manufacture of any embodiment of the IC structure 100 described herein), the wafer 2000 may undergo a singulation process in which each of the dies 2002 is separated from one another to provide discrete "chips" of the semiconductor product. In particular, devices that include one or more ion- or fixed charge-based field plate structures integrated with one or more transistors as disclosed herein may take the form of the wafer 2000 (e.g., not singulated) or the form of the die 2002 (e.g., singulated). The die 2002 may include one or more transistors (e.g., one or more transistors 102 as described herein), one or more ion- or fixed charge-based field plate structures (e.g., one or more ion- or fixed charge-based field plate structures 104 as described herein) as well as, optionally, supporting circuitry to route electrical signals to the transistors, as well as any other IC components. In some embodiments, the wafer 2000 or the die 2002 may implement an RF FE device, a memory device (e.g., a static RAM (SRAM) device), a logic device (e.g., an AND, OR, NAND, or NOR gate), or any other suitable circuit element. Multiple ones of these devices may be combined on a single die 2002.

FIG. 6 is a side, cross-sectional view of an example IC package 2200 that may include one or more IC structures having one or more ion- or fixed charge-based field plate structures integrated with one or more transistors in accordance with any of the embodiments disclosed herein. In some embodiments, the IC package 2200 may be a system-in-package (SiP).

As shown in FIG. 6, the IC package 2200 may include a package substrate 2252. The package substrate 2252 may be formed of a dielectric material (e.g., a ceramic, a glass, a combination of organic and inorganic materials, a buildup film, an epoxy film having filler particles therein, etc., and may have embedded portions having different materials), and may have conductive pathways extending through the dielectric material between the face 2272 and the face 2274, or between different locations on the face 2272, and/or between different locations on the face 2274.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 6 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 6 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 6 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 7.

The dies 2256 may take the form of any of the embodiments of the die 2002 discussed herein and may include any of the embodiments of an IC structure having one or more ion- or fixed charge-based field plate structures integrated with one or more transistors, e.g., any of the IC structures 100, described herein. In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be RF FE dies, one or more of the dies 2256 may be logic dies (e.g., silicon-based dies), one or more of the dies 2256 may be memory dies (e.g., high bandwidth memory), etc. In some embodiments, any of the dies 2256 may include one or more ion- or fixed charge-based field plate structures integrated with one or more transistors e.g., as discussed above; in some embodiments, at least some of the dies 2256 may not include any ion- or fixed charge-based field plate structures integrated with transistors.

The IC package 2200 illustrated in FIG. 6 may be a flip chip package, although other package architectures may be used. For example the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 6, an IC package 2200 may include any desired number of the dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

FIG. 7 is a cross-sectional side view of an IC device assembly 2300 that may include components having one or more IC structures implementing one or more ion- or fixed charge-based field plate structures integrated with one or more transistors in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the IC structures implementing one or more on or fixed charge-based field plate structures integrated with one or more transistors in accordance with any of the embodiments disclosed herein; e.g., any of the IC packages discussed below with reference to the IC device assembly 2300 may take the form of any of the embodiments of the IC package 2200 discussed above with reference to FIG. 6 (e.g., may include one or more ion- or fixed charge-based field plate structures integrated with one or more transistors in/on a die 2256).

In some embodiments, the circuit board 2302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 7 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (e.g., as shown in FIG. 7), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 5B), an IC device (e.g., the IC structure of FIGS. 1-2), or any other suitable component. In particular, the IC package 2320 may include one or more ion- or fixed charge-based field plate structures integrated with one or more transistors as described herein. Although a single IC package 2320 is shown in FIG. 7, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 7, the IC package 2320 and the circuit hoard 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) protection devices, and memory devices. More complex devices such as further RF devices, power amplifiers, power management devices, antennas, arrays, sensors, and microelectromechanical systems (MEMS) devices may also be formed on the interposer 2304. In some embodiments, the IC structures implementing one or more ion- or fixed charge-based field plate structures integrated with one or more transistors as described herein may also be implemented in/on the interposer 2304. The package-on-interposer structure 2336 may take the form of any of the package-on-interposer structures known in the art.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 7 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

FIG. 8 is a block diagram of an example computing device 2400 that may include one or more components with one or more IC structures having one or more ion- or fixed charge-based field plate structures integrated with one or more transistors in accordance with any of the embodiments disclosed herein. For example, any suitable ones of the components of the computing device 2400 may include a die (e.g., the die 2002 (FIG. 5B)) including one or more ion- or fixed charge-based field plate structures integrated with one or more transistors in accordance with any of the embodiments disclosed herein. Any of the components of the computing device 2400 may include an IC device (e.g., any embodiment of the IC structure of FIGS. 1-2) and/or an IC package 2200 (FIG. 6). Any of the components of the computing device 2400 may include an IC device assembly 2300 (FIG. 7).

A number of components are illustrated in FIG. 8 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single SoC die.

Additionally, in various embodiments, the computing device 2400 may not include one or more of the components illustrated in FIG. 8, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific ICs (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., DRAM), nonvolatile memory (e.g., read-only memory (ROM)), flash memory, solid-state memory, and/or a hard drive. In some embodiments, the memory 2404 may include memory that shares a die with the processing device 2402. This memory may be used as cache memory and may include, e.g., eDRAM, and/or spin transfer torque magnetic random-access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

In various embodiments, IC structures as described herein may be particularly advantageous for use within the one or more communication chips 2412, described above. For example, such IC structures may be used to implement one or more of power amplifiers, low-noise amplifiers, filters (including arrays of filters and filter banks), switches, upconverters, downconverters, and duplexers, e.g., as a part of implementing an RF transmitter, an RF receiver, or an RF transceiver.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC structure that includes a transistor having a channel material, a gate electrode, and a drain electrode; a dielectric material, provided between the gate electrode and the drain electrode, above the channel material (i.e., the channel material is between the dielectric material and a substrate); and a region within the dielectric material (i.e., a region between the gate electrode and the drain electrode), the region including a plurality of ions or fixed charges.

Example 2 provides the IC structure according to example 1, where the plurality of ions or fixed charges within the region are at a concentration of at least $10^{16}$ ions or fixed charges $cm^{-3}$, preferably of at least about $10^{18}$ $cm^{-3}$.

Example 3 provides the IC structure according to examples 1 or 2, where the plurality of ions or fixed charges are arranged in a layer of ions or fixed charges.

Example 4 provides the IC structure according to example 3, where the layer of ions or fixed charges is enclosed in the dielectric material.

Example 5 provides the IC structure according to any one of the preceding examples, where a thickness of a portion of the dielectric material that is between the layer of ions or fixed charges and the channel material is between 1 and 100 nanometers, preferably between about 5 and 30 nanometers.

Example 6 provides the IC structure according to any one of examples 3-5, where a distance from the layer of ions or fixed charges to the gate electrode is between 10 and 2000 nanometers, preferably between about 20 and 500 nanometers.

Example 7 provides the IC structure according to any one of examples 3-6, where a distance from the layer of ions or fixed charges to the drain electrode is between 10 and 2000 nanometers, preferably between about 20 and 500 nanometers.

Example 8 provides the IC structure according to any one of examples 3-7, where a thickness of the layer of ions or fixed charges is between 3 and 50 nanometers, preferably between about 3 and 15 nanometers.

Example 9 provides the IC structure according to any one of examples 3-8, where a length of the layer of ions or fixed charges (a dimension measured in a direction parallel to a line connecting the gate electrode and the drain electrode) is between 10 and 2000 nanometers, preferably between about 25 and 1000 nanometers.

Example 10 provides the IC structure according to any one of the preceding examples, where the region is a first region, the plurality of ions or fixed charges is a first plurality of ions or fixed charges, and the IC structure further includes a second region within the dielectric material (i.e., a region between the gate electrode and the drain electrode), the second region including a second plurality of ions or fixed charges, where the second plurality of ions or fixed charges within the second region are at a concentration of at least about $10^{16}$ ions or fixed charges $cm^{-3}$, preferably of at least about $10^{18}$ $cm^{-3}$.

Example 11 provides the IC structure according to example 10, where the first plurality of ions or fixed charges are arranged in a first layer of ions or fixed charges, and the second plurality of ions or fixed charges are arranged in a second layer of ions or fixed charges.

Example 12 provides the IC structure according to example 11, where the second layer of ions or fixed charges is farther away from the channel material than the first layer of ions or fixed charges.

Example 13 provides the IC structure according to examples 11 or 12, where a thickness of a portion of the dielectric material that is between the first layer of ions or fixed charges and the channel material is between about 1 and 100 nanometers, preferably between about 5 and 30 nanometers, and a thickness of a portion of the dielectric material that is between the first layer of ions or fixed charges and the second layer of ions or fixed charges is between about 1 and 50 nanometers, preferably between about 5 and 35 nanometers.

Example 14 provides the IC structure according to any one of examples 11-13, where the second layer of ions or fixed charges is embedded in, or enclosed by, the dielectric material.

Example 15 provides the IC structure according to any one of examples 11-14, where a projection of the second layer of ions or fixed charges onto a plane of the channel material partially overlaps with a projection of the first layer of ions or fixed charges onto the plane of the channel material (thus, one layer of ions may be stacked over the other layer of ions, but with an offset).

Example 16 provides the IC structure according to any one of examples 11-14, where a projection of the second layer of ions or fixed charges onto a plane of the channel material does not overlap with a projection of the first layer of ions or fixed charges onto the plane of the channel material (thus, the two layers may be in different planes above the substrate, but arranged so that they do not overlap, i.e., arranged so that they are provided over different portions of the channel material).

Example 17 provides the IC structure according to any one of the preceding examples, where the plurality of ions or fixed charges include anions.

Example 18 provides the IC structure according to any one of the preceding examples, where the plurality of ions or fixed charges include fluorine ions or fixed charges.

Example 19 provides the IC structure according to any one of the preceding examples, where the channel material is an III-N channel material, and the transistor further includes a polarization material (e.g., a semiconductor material having stronger piezo-polarization behavior/properties than the III-N channel material), where at least a portion of the polarization material forms a heterojunction interface with at least a portion of the III-N channel material.

In various further examples, the IC structure according to any one of the preceding examples may be included in, or used to implement at least a portion of, an RF FE.

Example 20 provides an IC package that includes an IC die, the IC die that includes the IC structure according to any one of the preceding examples (e.g., the IC structure according to any one of examples 1-19); and a further IC component, coupled to the IC die.

Example 21 provides an IC package that includes an IC die that includes a transistor including a channel material, a gate electrode, and a S/D (e.g., drain) electrode, the IC die further including a layer including ions or fixed charges at a concentration of at least about $10^{16}$ ions or fixed charges $cm^{-3}$, preferably of at least about $10^{18}$ $cm^{-3}$ embedded in, or enclosed by, an insulator material above the channel material, between the gate electrode and the S/D electrode of the transistor. The IC package also includes a further IC component, coupled to the IC die.

Example 22 provides the IC package according to examples 20 or 21, where the further IC component includes one of a package substrate, an interposer, or a further IC die.

Example 23 provides a computing device that includes a carrier substrate and an IC die coupled to the carrier substrate, where the IC die includes the IC structure according to any one of examples 1-19, or is included in the IC package according to any one of examples 20-22.

Example 24 provides the computing device according to example 23, where the computing device is a wearable or handheld computing device.

Example 25 provides the computing device according to examples 23 or 24, where the computing device further includes one or more communication chips and an antenna.

Example 26 provides the computing device according to any one of examples 23-25, where the carrier substrate is a motherboard.

Example 27 provides a method of manufacturing an IC structure, the method including: providing a transistor over a support structure, the transistor including a gate electrode and a drain electrode; providing an insulator material between the gate electrode and the drain electrode of the transistor; and providing a layer including ions or fixed charges at a concentration of at least $10^{16}$ ions or fixed charges $cm^{-3}$, embedded in the insulator material between the gate electrode and the drain electrode of the transistor.

Example 28 provides the method according to example 27, where providing the layer includes performing ion implantation to embed the ions in the insulator material between the gate electrode and the drain electrode of the transistor.

Example 29 provides the method according to example 27, where providing the layer includes performing CVD or ALD with carefully selected deposition conditions (e.g., providing anion-rich environment in the reaction chamber of the CVD or ALD process, doping of the dielectric material being grown with negatively charged impurity atoms, and adding positively charged hydrogen atoms to the reaction chamber to enable hydrogen ambient growth) to embed the fixed charges in the insulator material between the gate electrode and the drain electrode of the transistor.

Example 30 provides the method according to any one of examples 27-29, where the IC structure is the IC structure according to any one of examples 1-19, and the method includes corresponding further processes to manufacture any of these IC structures.

Example 31 provides an electronic device that includes an RF device that includes one or more of the IC structure according to any one of claims 1-19 and the IC package according to any one of claims 20-22; and, additionally, may also include a further component, coupled to the RF device.

Example 32 provides the electronic device according to example 31, where the further component is a computing device, and/or includes one or more of a communication chip and an antenna.

Example 33 provides the electronic device according to examples 31 or 32, where the further component includes one of a carrier substrate, a package substrate, an interposer, or an IC die.

Example 34 provides the electronic device according to any one of examples 31-33, where the RF device is an RF front-end component.

Example 35 provides the electronic device according to any one of examples 31-34, where the electronic device is a UE device.

Example 36 provides the electronic device according to any one of examples 31-35, where the electronic device is a base station.

Example 37 provides the electronic device according to any one of examples 31-36, where the transistor of the electronic device is included in an amplifier.

Example 38 provides the electronic device according to example 37, where the transistor is one of a plurality of transistors included in the amplifier.

Example 39 provides the electronic device according to examples 37 or 38, where the amplifier is a low-noise amplifier.

Example 40 provides the electronic device according to example 39, where the RF device is an RF receiver.

Example 41 provides the electronic device according to any one of examples 31-40, where the RF device is an RF transceiver.

Example 42 provides the electronic device according to example 41, where the RF device is a frequency division duplex RF transceiver.

Example 43 provides the electronic device according to example 42, further including a duplexer.

Example 44 provides the electronic device according to any one of examples 31-43, further including an antenna for receiving and transmitting RF signals.

Example 45 provides the electronic device according to any one of examples 31-44, further including a downconverter for downconverting received RF signals.

Example 46 provides the electronic device according to any one of examples 31-45, further including one or more local oscillators for providing one or more local oscillator signals to be used in downconverting received RF signals.

Example 47 provides the electronic device according to any one of examples 31-46, further including an upconverter for upconverting signals to be transmitted as RF signals.

Example 48 provides the electronic device according to any one of examples 31-47, further including one or more local oscillators for providing one or more local oscillator signals to be used in upconverting the signals to be transmitted.

Example 49 provides the electronic device according to any one of examples 31-48, further including one or more analog-to-digital converters for converting signals (e.g., received signals) from analog domain to digital domain.

Example 50 provides the electronic device according to any one of examples 31-49, further including one or more digital-to-analog converters for converting signals (e.g., signals to be transmitted) from digital domain to analog domain.

The above description of Illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize. These modifications may be made to the disclosure in light of the above detailed description.

The invention claimed is:

1. An integrated circuit (IC) structure, comprising:
a transistor, including:
a channel material,
a gate electrode, and
a drain electrode;
a dielectric material, between the gate electrode and the drain electrode; and
a region within the dielectric material, the region including a plurality of ions and being laterally confined between the gate electrode and the drain electrode.

2. The IC structure according to claim 1, wherein the plurality of ions within the region are at a concentration of at least $10^{16}$ ions per cubic centimeter.

3. The IC structure according to claim 1, wherein the plurality of ions are arranged in a layer of ions and the layer is enclosed in the dielectric material.

4. The IC structure according to claim 3, wherein a distance from the layer of ions to the gate electrode is between 10 and 2000 nanometers, or a distance from the layer of ions to the drain electrode is between 10 and 2000 nanometers.

5. The IC structure according to claim 3, wherein a thickness of the layer of ions is between 3 and 50 nanometers.

6. The IC structure according to claim 3, wherein a length of the layer of ions is between 10 and 2000 nanometers.

7. The IC structure according to claim 1, wherein a thickness of a portion of the dielectric material that is between the region with the plurality of ions and the channel material is between 1 and 100 nanometers.

8. The IC structure according to claim 1, wherein:
the region is a first region,
the plurality of ions is a first plurality of ions, and
the IC structure further includes a second region within the dielectric material, the second region including a second plurality of ions, wherein the second plurality of ions within the second region are at a concentration of at least $10^{16}$ ions per cubic centimeter.

9. The IC structure according to claim 8, wherein:
the first plurality of ions are arranged in a first layer of ions, and
the second plurality of ions are arranged in a second layer of ions.

10. The IC structure according to claim 9, wherein:
a thickness of a portion of the dielectric material that is between the first layer of ions and the channel material is between 1 and 100 nanometers, and
a thickness of a portion of the dielectric material that is between the first layer of ions and the second layer of ions is between 1 and 50 nanometers.

11. The IC structure according to claim 9, wherein a projection of the second layer of ions onto a plane of the channel material partially overlaps with a projection of the first layer of ions onto the plane of the channel material.

12. The IC structure according to claim 9, wherein a projection of the second layer of ions onto a plane of the channel material does not overlap with a projection of the first layer of ions onto the plane of the channel material.

13. The IC structure according to claim 1, wherein the plurality of ions includes anions.

14. The IC structure according to claim 1, wherein the plurality of ions includes fluorine ions.

15. The IC structure according to claim 1, wherein the channel material is an III-N channel material, and the transistor further includes a polarization material, where at least a portion of the polarization material forms a heterojunction with at least a portion of the III-N channel material.

16. The IC structure according to claim 1, wherein a projection of the region onto a plane of the channel material is non-overlapping with a projection of the gate electrode onto the plane of the channel material and a projection of the drain electrode onto the plane of the channel material.

17. An integrated circuit (IC) package, comprising:
an IC die, including:
a transistor comprising a channel material, a gate electrode, and a further electrode, wherein the further electrode is either a source electrode or a drain electrode, and
a layer comprising ions at a concentration of at least $10^{16}$ ions per cubic centimeter, embedded in an insulator material above the channel material, between the gate electrode and the further electrode of the transistor, wherein a projection of the layer onto a plane of the channel material is non-overlapping with a projection of the gate electrode onto the plane of the channel material and a projection of the drain electrode onto the plane of the channel material; and
a further IC component, coupled to the IC die.

18. The IC package according to claim 17, wherein the further IC component includes one of a package substrate, an interposer, or a further IC die.

19. An integrated circuit (IC) structure, comprising:
one or more semiconductor materials;
a transistor, comprising a channel region, a gate electrode, and a drain electrode, wherein the channel region includes a portion of the one or more semiconductor materials;
an insulator material between the gate electrode and the drain electrode; and
a layer of fixed charges embedded in the insulator material, wherein the layer of fixed charges is laterally between the gate electrode and the drain electrode and is separated from each of the gate electrode and the drain electrode by respective portions of the insulator material.

20. The IC structure according to claim 19, wherein the layer of fixed charges includes a region with a concentration of at least $10^{16}$ fixed charges per cubic centimeter.

21. The IC structure according to claim 19, wherein a distance from the layer of fixed charges to the gate electrode is between 10 and 2000 nanometers, or a distance from the layer of fixed charges to the drain electrode is between 10 and 2000 nanometers.

22. The IC structure according to claim 19, wherein a thickness of the layer of fixed charges is between 3 and 50 nanometers.

23. The IC structure according to claim 19, wherein a projection of the layer of fixed charges onto a plane of the channel region is non-overlapping with a projection of the gate electrode onto the plane of the channel region and a projection of the drain electrode onto the plane of the channel region.

24. An integrated circuit (IC) package, comprising:
an IC die, including:
- a transistor comprising a channel material, a gate electrode, and a further electrode, wherein the further electrode is either a source electrode or a drain electrode, and
- a layer comprising fixed charges at a concentration of at least $10^{16}$ fixed charges per cubic centimeter, embedded in an insulator material above the channel material, between the gate electrode and the further electrode of the transistor, wherein a projection of the layer onto a plane of the channel material is non-overlapping with a projection of the gate electrode onto the plane of the channel material and a projection of the drain electrode onto the plane of the channel material; and a further IC component, coupled to the IC die.

25. The IC package according to claim 24, wherein the further IC component includes one of a package substrate, an interposer, or a further IC die.

* * * * *

UNITED STATES PATENT AND TRADEMARK OFFICE
CERTIFICATE OF CORRECTION

PATENT NO. : 11,658,217 B2
APPLICATION NO. : 16/242670
DATED : May 23, 2023
INVENTOR(S) : Han Wui Then et al.

Page 1 of 1

It is certified that error appears in the above-identified patent and that said Letters Patent is hereby corrected as shown below:

In the Claims

In Column 29, Claim 3, Line 22, delete "the layer" and insert -- the layer of ions --, therefor.

In Column 30, Claim 17, Line 19, delete "electrode, and" insert -- electrode; --, therefor.

In Column 31, Claim 24, Line 6, delete "electrode, and" insert -- electrode; --, therefor.

Signed and Sealed this
Twenty-sixth Day of December, 2023

Katherine Kelly Vidal
*Director of the United States Patent and Trademark Office*